United States Patent
Kim et al.

(10) Patent No.: US 11,335,600 B2
(45) Date of Patent: May 17, 2022

(54) INTEGRATION METHOD FOR FINFET WITH TIGHTLY CONTROLLED MULTIPLE FIN HEIGHTS

(71) Applicant: Intel Corporation, Santa Clara, CA (US)

(72) Inventors: Seiyon Kim, Portland, OR (US); Jack T. Kavalieros, Portland, OR (US); Anand S. Murthy, Portland, OR (US); Glenn A. Glass, Portland, OR (US); Karthik Jambunathan, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/576,248

(22) PCT Filed: Jun. 27, 2015

(86) PCT No.: PCT/US2015/038193
§ 371 (c)(1),
(2) Date: Nov. 21, 2017

(87) PCT Pub. No.: WO2017/003410
PCT Pub. Date: Jan. 5, 2017

(65) Prior Publication Data
US 2018/0158737 A1    Jun. 7, 2018

(51) Int. Cl.
*H01L 29/06* (2006.01)
*H01L 21/8234* (2006.01)
(Continued)

(52) U.S. Cl.
CPC ........... *H01L 21/823412* (2013.01); *H01L 21/823431* (2013.01); *H01L 21/845* (2013.01);
(Continued)

(58) Field of Classification Search
CPC ............. Y10S 977/762; H01L 27/0886; H01L 29/0673; H01L 29/78696; H01L 29/0669;
(Continued)

(56) References Cited

U.S. PATENT DOCUMENTS 8,674,449 B2 * 3/2014 Zhu .................. H01L 29/66795
257/368
9,356,027 B1 * 5/2016 Cheng ................ H01L 27/0924
(Continued)

FOREIGN PATENT DOCUMENTS

| CN | 102956702 A | 3/2013 |
|----|-------------|--------|
| CN | 103915501 A | 7/2014 |

(Continued)

OTHER PUBLICATIONS

Zheng et al. Simulation-Based Study of the Inserted-Oxide FinFET for Future Low-Power System-on-Chip Applications. IEEE Electron Device Letters vol. 36, Iss. 8 (Jun. 1, 2015) (Year: 2015).*
(Continued)

*Primary Examiner* — Eric K Ashbahian
(74) *Attorney, Agent, or Firm* — Schwabe, Williamson & Wyatt, P.C.

(57) ABSTRACT

A method including forming a fin of a nonplanar device on a substrate, the fin including a second layer between a first layer and a third layer; replacing the second layer with a dielectric material; and forming a gate stack on a channel region of the fin. An apparatus including a first multigate device on a substrate including a fin including a conducting layer on a dielectric layer, a gate stack disposed on the conducting layer in a channel region of the fin, and a source and a drain formed in the fin, and a second multigate device on the substrate including a fin including a first conducting layer and a second conducting layer separated by a dielectric layer, a gate stack disposed the first conducting layer and the
(Continued)

second conducting layer in a channel region of the fin, and a source and a drain formed in the fin.

22 Claims, 10 Drawing Sheets

(51) Int. Cl.
    *H01L 29/78*     (2006.01)
    *H01L 27/088*     (2006.01)
    *H01L 21/84*     (2006.01)
    *H01L 27/12*     (2006.01)
    *H01L 29/66*     (2006.01)
    *H01L 29/423*     (2006.01)
    *H01L 29/786*     (2006.01)

(52) U.S. Cl.
    CPC ........ *H01L 27/088* (2013.01); *H01L 27/0886* (2013.01); *H01L 27/1211* (2013.01); *H01L 29/0673* (2013.01); *H01L 29/42392* (2013.01); *H01L 29/66545* (2013.01); *H01L 29/66742* (2013.01); *H01L 29/66795* (2013.01); *H01L 29/78* (2013.01); *H01L 29/785* (2013.01); *H01L 29/78696* (2013.01)

(58) Field of Classification Search
    CPC ......... H01L 29/42392; H01L 21/02603; H01L 21/823431; H01L 21/823821; H01L 21/823481; H01L 29/66795–66818
    See application file for complete search history.

(56) References Cited

U.S. PATENT DOCUMENTS

| | | | | |
|---|---|---|---|---|
| 2005/0239242 | A1* | 10/2005 | Zhu | H01L 29/785 438/199 |
| 2008/0157225 | A1* | 7/2008 | Datta | H01L 27/1116 257/401 |
| 2008/0259687 | A1* | 10/2008 | Specht | G11C 16/0483 365/185.17 |
| 2011/0115023 | A1 | 5/2011 | Cheng et al. | |
| 2013/0020640 | A1* | 1/2013 | Chen | H01L 29/785 257/347 |
| 2013/0082329 | A1 | 4/2013 | Chen et al. | |
| 2013/0181274 | A1* | 7/2013 | Saitoh | H01L 29/78 257/314 |
| 2013/0234215 | A1 | 9/2013 | Okano | |
| 2013/0341704 | A1 | 12/2013 | Rachmady et al. | |
| 2014/0001441 | A1* | 1/2014 | Kim | H01L 29/0673 257/29 |
| 2014/0091279 | A1* | 4/2014 | Kachian | B82Y 10/00 257/27 |
| 2014/0191321 | A1 | 7/2014 | Cheng et al. | |
| 2014/0239404 | A1* | 8/2014 | Huang | H01L 27/0924 257/369 |
| 2015/0021663 | A1 | 1/2015 | Akarvardar | |
| 2015/0021691 | A1 | 1/2015 | Akarvardar | |
| 2015/0021709 | A1 | 1/2015 | Jacob | |
| 2015/0056781 | A1 | 2/2015 | Akarvardar | |
| 2016/0254362 | A1* | 9/2016 | Maitrejean | H01L 29/78684 438/694 |
| 2016/0380053 | A1* | 12/2016 | Cohen | H01L 29/7856 257/401 |

FOREIGN PATENT DOCUMENTS

| | | |
|---|---|---|
| KR | 10-2014-0097521 | 8/2014 |
| TW | 201344909 | 11/2013 |
| TW | 201405806 | 2/2014 |
| WO | WO 2013/095384 | 6/2013 |

OTHER PUBLICATIONS

International Preliminary Report on Patentability for International Patent Application No. PCT/US2015/038193, dated Jan. 11, 2018, 7 pages.
International Search Report and Written Opinion for International Patent Application No. PCT/US2015/038193 dated Mar. 31, 2016, 10 pgs.
Office Action from Taiwan Patent Application No. 105116127, dated Sep. 20, 2019, 12 pgs.
Search Report for European Patent Application No. 15897301.6, dated Apr. 15, 2019, 8 pgs.
Office Action from Taiwan Patent Application No. 105116127, dated Feb. 19, 2020, 13 pgs.
Office Action from Korean Patent Application No. 10-2018-7002638, dated Aug. 23, 2021, 7 pgs.
Office Action from Chinese Patent Application No. 201580080409.1, dated May 28, 2021, 5 pgs.
Office Action from Chinese Patent Application No. 201580080409.1, dated Nov. 15, 2021, 9 pgs.
Office Action from Korean Patent Application No. 10-2018-7002638 dated Feb. 18, 2022, 3 pgs.

* cited by examiner

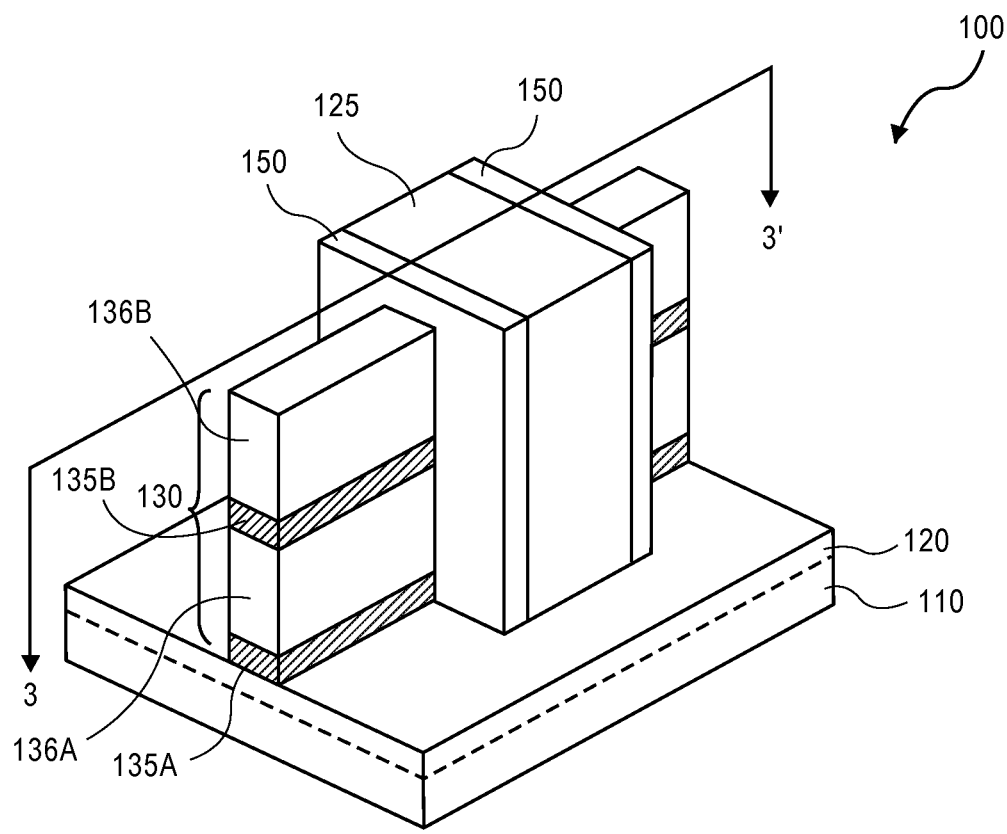
FIG. 2
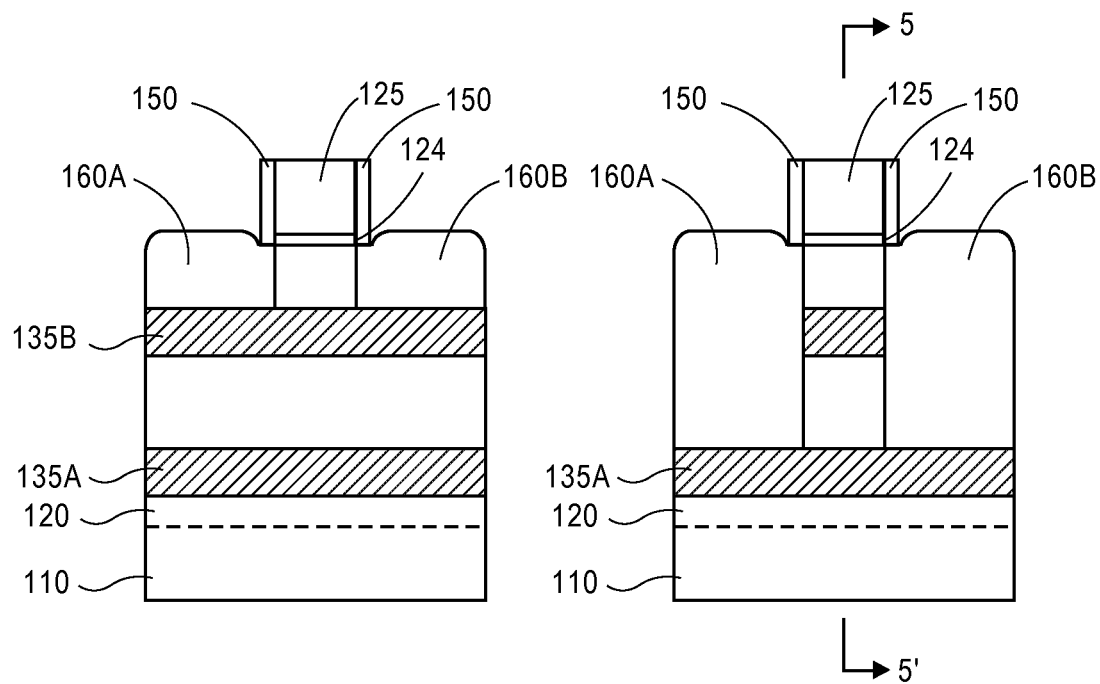
FIG. 3A  FIG. 3B

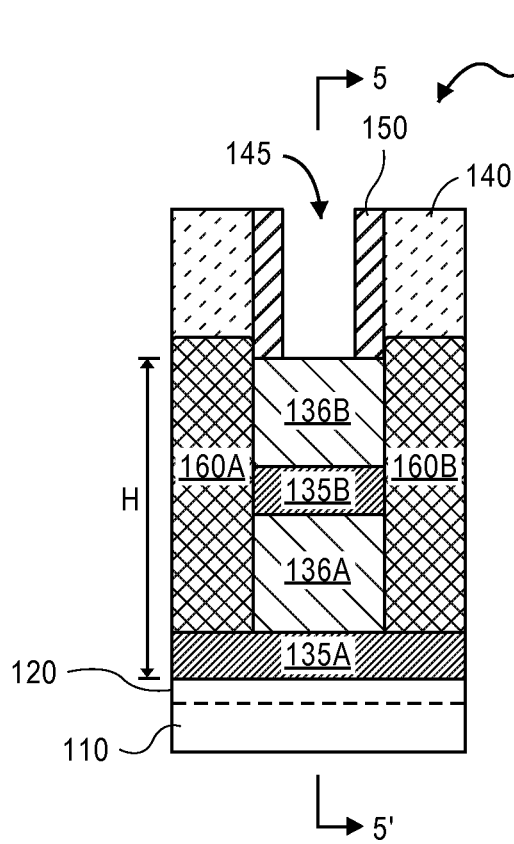
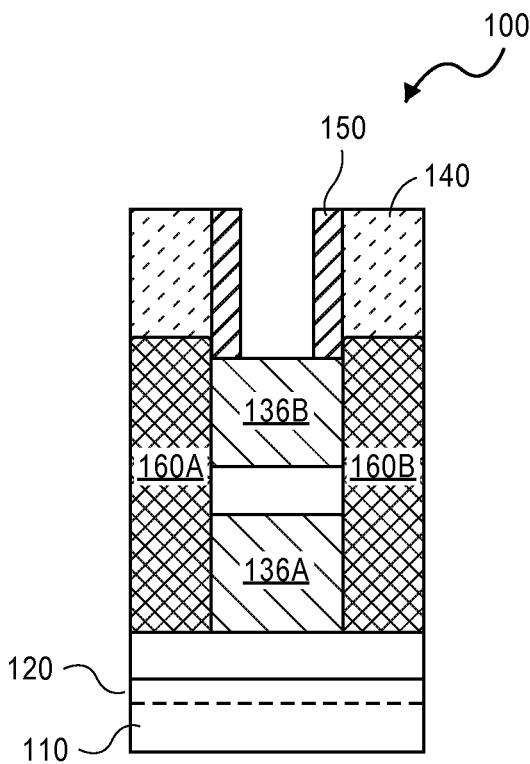
FIG. 4  FIG. 6
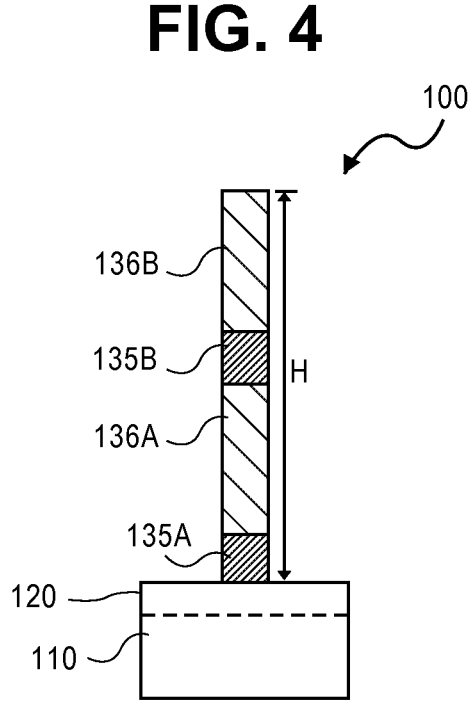
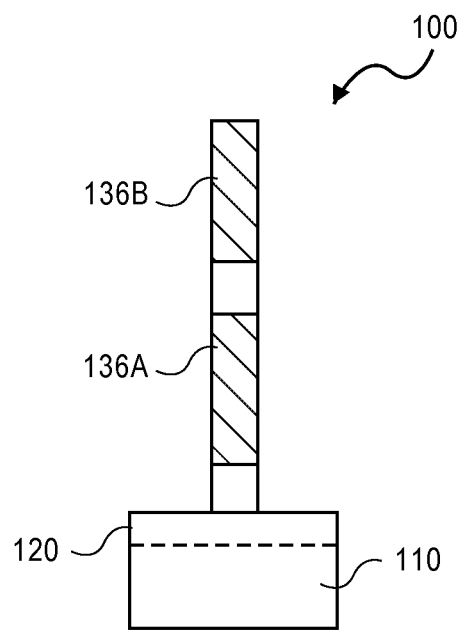
FIG. 5  FIG. 7

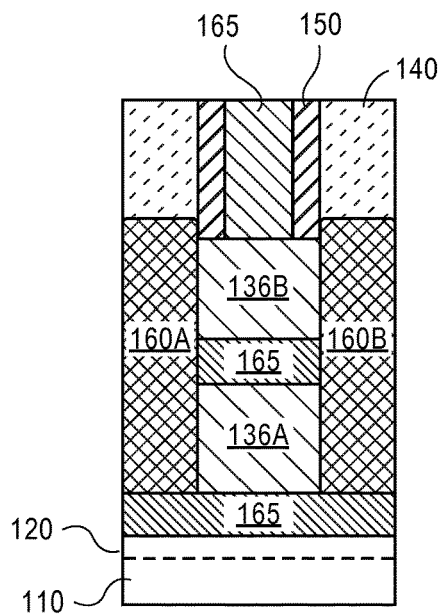
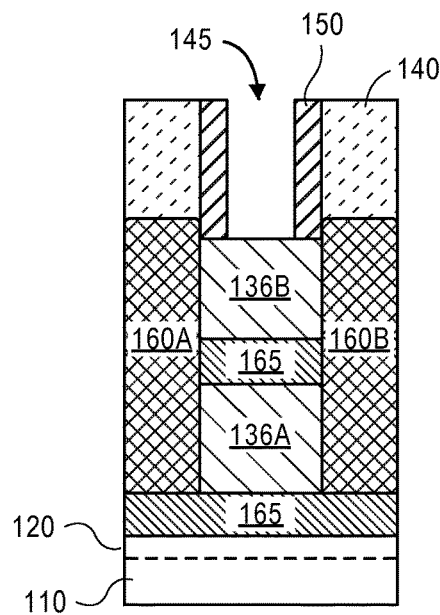
FIG. 8
FIG. 10
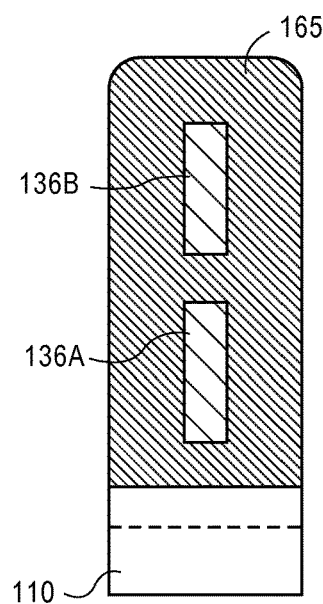
FIG. 9
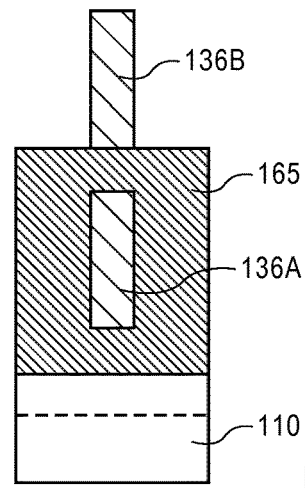
FIG. 11A
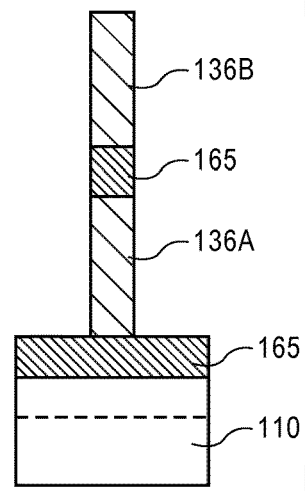
FIG. 11B

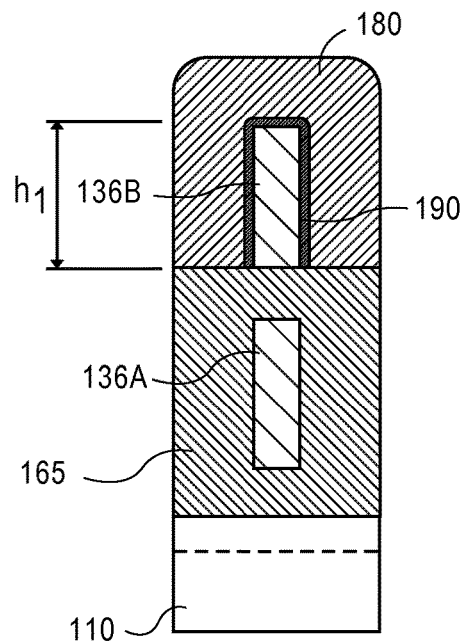
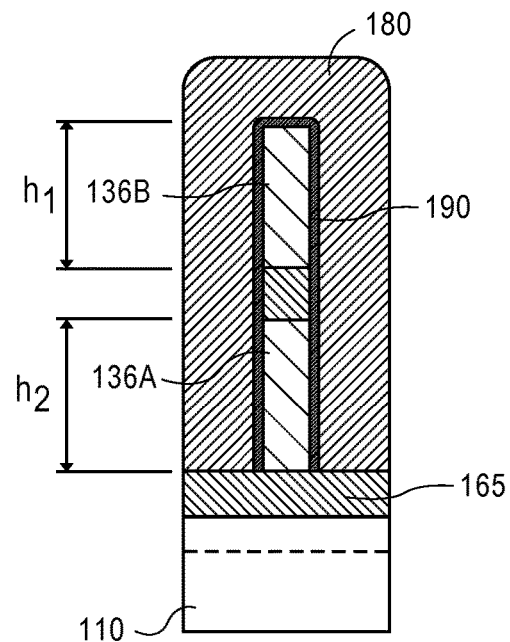
FIG. 12A    FIG. 12B
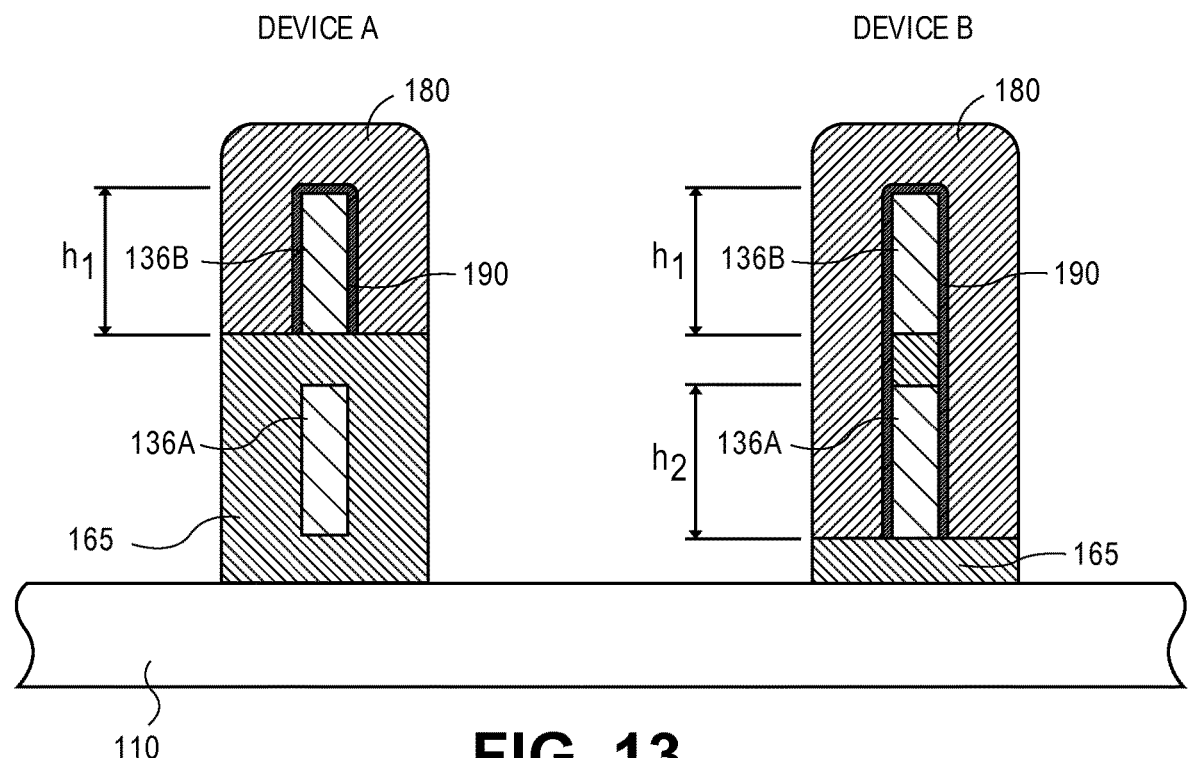
FIG. 13

INTEGRATION METHOD FOR FINFET WITH TIGHTLY CONTROLLED MULTIPLE FIN HEIGHTS

CROSS-REFERENCE TO RELATED APPLICATION

This patent application is a U.S. National Phase Application under 35 U.S.C. § 371 of International Application No. PCT/US2015/038193, filed Jun. 27, 2015, entitled "INTEGRATION METHOD FOR FINFET WITH TIGHTLY CONTROLLED MULTIPLE FIN HEIGHTS," which designates the United States of America, the entire disclosure of which is hereby incorporated by reference in its entirety and for all purposes.

TECHNICAL FIELD

Semiconductor devices including non-planar semiconductor devices having channel regions with low band-gap cladding layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Future circuit devices, such as central processing unit devices, will desire both high performance devices and low capacitance, low power devices integrated in a single dye or chip. Currently, three-dimensional non-planar metal oxide semiconductor field-effect transistors (MOSFETs) generally utilize fins of a single height. Single height fins tend to limit design, and require compromises.

BRIEF DESCRIPTION OF THE DRAWINGS

FIG. 2 shows the structure of FIG. 1 following the formation and patterning of a sacrificial or dummy gate on a channel region of the fin.

FIG. 3A shows an embodiment of the structure of FIG. 2 through line 3-3' after forming a shallow, source and drain.

FIG. 3B shows another embodiment of the structure of FIG. 2 through line 3-3' after forming a deep source and drain.

FIG. 4 shows the structure of FIG. 3B after removing the sacrificial or dummy gate stack.

FIG. 5 is a cross-sectional view through line 5-5' of FIG. 4.

FIG. 6 shows the structure of FIG. 4 following the removal of the layers of sacrificial material.

FIG. 7 shows the structure of FIG. 5 following the removal of the layers of sacrificial material.

FIG. 8 shows the structure of FIG. 6 following the introduction of a dielectric material in the openings (volumes) created by the removal of the layers of sacrificial material.

FIG. 9 shows the structure of FIG. 7 following the introduction of a dielectric material in the openings (volumes) created by the removal of the layers of sacrificial material.

FIG. 10 shows the structure of FIG. 8 following the removal of a portion of the dielectric material to expose a portion of the layers of active material.

FIG. 11A shows the structure of FIG. 9 following the removal of a portion of the dielectric material to expose a first layer of active material in a gate electrode or channel region.

FIG. 11B shows the structure of FIG. 9 following the removal of a portion of the dielectric material to expose a first layer and a second layer of active material in a gate electrode or channel region.

FIG. 12A shows the structure of FIG. 11A following the introduction of a gate stack selectively on one layer of active material relative to the other.

FIG. 12B shows the structure of FIG. 11A following the introduction of a gate stack each of the layers of active material.

FIG. 13 shows cross-sectional views of two three dimensional devices on a substrate, each device having a different channel height.

DESCRIPTION OF THE EMBODIMENTS

Embodiments described herein are directed to non-planar semiconductor devices (e.g., three-dimensional devices) having a targeted or predetermined channel heights and methods of making non-planar semiconductor devices of a targeted or predetermined channel height on a substrate wherein such channel height may be one of multiple fin heights of devices on the substrate. In one such embodiment, a gate stack of a non-planar device surrounds a channel region of the fin (such as a tri-gate or fin-fet device). The methods allow incorporating three-dimensional devices having different fin heights on a chip or die such as high performance devices requiring high current with low capacitance, lower power devices.

FIGS. 1-12B describe a method or process of forming a non-planar multi-gate semiconductor device having a tailored or selected fin or channel height or modifying a fin or channel height of a non-planar multi-gate semiconductor device from an initial height to a targeted height that is different from the initial height. A method of forming a non-planar multi-gate device with tailored junction region (source and drain) depth is also described. In one embodiment, the device is a three-dimensional metal oxide semiconductor field effect transistor (MOSFET) and is an isolated device or is one device in a plurality of nested devices. As will be appreciated, for a typical integrated circuit, both N- and P-channel transistors may be fabricated on a single substrate to form a complimentary metal oxide semiconductor (CMOS) integrated circuit. Furthermore, additional interconnect may be fabricated in order to integrate such devices into an integrated circuit.

In the fabrication of non-planar transistors, such as trigate transistors and FinFETs, non-planar semiconductor bodies may be used to form transistors capable of full depletion with relatively small gate lengths (e.g., less than about 30 nm). These semiconductor bodies are generally fin-shaped and are, thus, generally referred to as transistor "fins". For example in a tri-gate transistor, the transistor fin has a top surface and two opposing sidewalls formed on a bulk semiconductor substrate or a silicon-on-insulator substrate. A gate dielectric may be formed on the top or superior surface and sidewalls of the semiconductor body and a gate electrode may be formed over the gate dielectric on the top or superior surface of the semiconductor body and adjacent to the gate dielectric on the sidewalls of the semiconductor body. Since the gate dielectric and the gate electrode are adjacent to three surfaces of the semiconductor body, three separate channels and gates are formed. As there are three separate channels formed, the semiconductor body can be fully depleted when the transistor is turned on. With regard to finFET transistors, the gate material and the electrode contact the sidewalls of the semiconductor body, such that two separate channels are formed.

Figure 1:
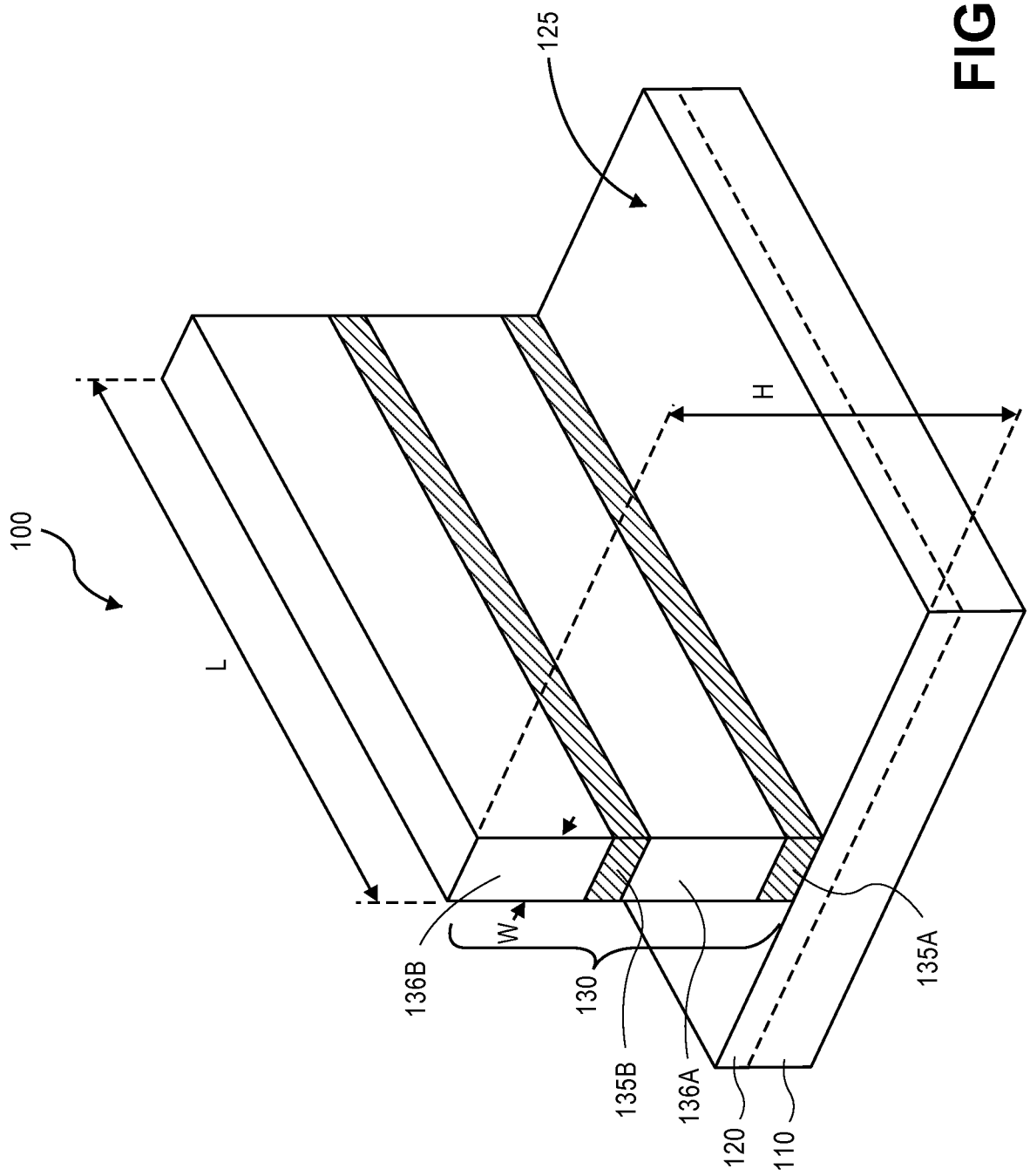
FIG. 1 shows a top side perspective view of a portion of a substrate that is, for example, a portion of an integrated circuit die or chip on a wafer and has a fin of a three-dimensional circuit device formed on a surface of the substrate.

FIG. 1 shows a top side perspective view of a portion of a silicon or silicon-on-insulator (SOI) substrate that is, for example, a portion of an integrated circuit die or chip on a wafer. Specifically, FIG. 1 shows structure 100 including substrate 110 of silicon or SOI. Overlaying substrate 110 is optional buffer layer 120. In one embodiment, a buffer layer is a silicon germanium buffer introduced, in one embodiment, on substrate 110 by a growth technique. Representatively, buffer layer 120 has a representative thickness on the order of a few hundred nanometers (nm).

Disposed on a surface of substrate 110 and optional buffer layer 120 (surface 125), in the embodiment illustrated in FIG. 1, is a portion of a transistor device such as an N-type transistor device or a P-type transistor device. Common to an N-type or P-type transistor device, in this embodiment, is body or fin 130 disposed on a surface (surface 125) of buffer layer 120. In one embodiment, at this point, fin 130 is formed of alternating layers of active material and sacrificial material. A suitable active material is a semiconductor material such as silicon. A suitable sacrificial material is a material having a lattice structure similar to a lattice structure of the material of the active layer or is a material that will not disrupt (e.g., strain) a lattice of the active material or is deposited to a thickness such that it will not disrupt (e.g., strain) a lattice of the active material. A suitable sacrificial material is also a material that can be selectively removed relative to active material. An example of a sacrificial material to be used with an active material of silicon is silicon germanium material. FIG. 1 shows sacrificial layer 135A (a base layer) on surface 125 of substrate 110 (on optional buffer layer 120); active layer 136A (a first layer) of silicon on sacrificial layer 135A; sacrificial layer 135B (a second layer) on active layer 136A; and active layer 136B (a third layer) on sacrificial layer 135B. In one embodiment, the alternating layers 135A-136B of sacrificial material and active material are formed according to conventional processing techniques for forming a three-dimensional integrated circuit device. Representatively, layers 135A-136B are epitaxially grown on the substrate and then formed into fin 130 (e.g., by a masking and etch process). For an active material of silicon and a sacrificial material of silicon germanium, a representative thickness of each silicon active layer (active layers 136A and 136B) is in the range of 30 nanometers (nm) to 50 nm and each silicon germanium sacrificial layer (sacrificial layers 135A and 135B) is in the range of 5 nm to 10 nm. It is appreciated that a thickness of the layers can vary depending on a circuit requirement.

In one embodiment, fin 130 has a length dimension, L, greater than a height dimension, H. A representative length range is on the order of 10 nanometers (nm) to 1 millimeter (mm), and a representative height range is on the order of 5 nm to 200 nm. Fin 130 also has a width, W, representatively on the order of 4-10 nm. As illustrated, fin 130 is a three-dimensional body extending from or on surface 125 of substrate 110 (or optionally from or on buffer layer 120). The three-dimensional body as illustrated in FIG. 1 is a rectangular body, but it is appreciated that in processing of such bodies, a true rectangular form may not be achievable with available tooling, and other shapes may result. Representative shapes include, but are not limited to, a trapezoidal shape (e.g., base wider than top) and an arch shape.

FIG. 2 shows a top side perspective view of the structure of FIG. 1 following the formation of a sacrificial or dummy gate stack on fin 130. In one embodiment, a gate stack includes a gate dielectric layer of, for example, silicon dioxide or a dielectric material having a dielectric constant greater than silicon dioxide (a high k dielectric material). Disposed on the gate dielectric layer, in one embodiment, is sacrificial or dummy gate 125 of, for example, polysilicon deposited by, for example, a chemical vapor deposition method. In one embodiment, to form the gate stack, a gate dielectric material is formed on the structure of FIG. 1 such as by way of a blanket deposition followed by a blanket deposition of the sacrificial or dummy gate material. A mask material is introduced over the structure and patterned to protect the gate stack material over a designated channel region. An etch process is then used to remove the gate stack material in undesired areas and pattern the gate stack over a designated channel region. The gate stack may include a spacer dielectric layers on opposite sides thereof. A representative material for spacers 150 is a low k material such as silicon nitride (SiN) or silicon carbon nitrogen (SiCN). FIG. 2 shows spacers 150 adjacent the sidewalls of the gate stack and on the fin 130. One technique to form spacers 150 is to deposit a film on the structure, protect the film in a desired area and then etch to pattern the film into desired spacer dimensions.

FIGS. 3A and 3B show two different embodiments of the structure of FIG. 2 through line 3-3' illustrating a formation of junction regions (source and drain) in fin 130. The source and drain are formed in fin 130 on opposite sides of the gate stack (sacrificial gate electrode 125 on gate dielectric 124). Source 160A and drain 160B may be formed by removing portions of the fin material and epitaxially introducing source and drain material. Representative material for source 160A and drain 160B include, but are not limited to, silicon, silicon germanium, or a group III-V or group IV-V compound semiconductor material. FIG. 3A shows active layer 136B removed from a region designated for source 160A and active layer 136B from a region designated for drain 160B. In this embodiment, source 160A and drain 160B are formed to a depth of the prior active layer 136B. In this embodiment, sacrificial layer 135B is used as an etch stop when removing material to form a junction and each of source 160A and drain 160B are formed on a surface of sacrificial layer 135B. FIG. 3B shows active layer 136B, active layer 136A and sacrificial layer 135B removed in designated junction regions. In this embodiment, sacrificial layer 135A is used as an etch stop in removing material for a source and for drain. In one embodiment, source 160A and drain 160B are formed to a depth of the combined prior layers. FIG. 3A may be characterized as a device structure having shallow source and drain and FIG. 3B as a device structure with deep source and drain.

FIGS. 4-12B describe the formation of embodiments devices based on the device structure of FIG. 3B characterized by a deep source and drain. It is appreciated that alternatively devices can be formed based on the device structure of FIG. 3A.

FIG. 4 shows the structure of FIG. 3B after a removal of the sacrificial or dummy gate stack. In one embodiment, prior to removal of the sacrificial or dummy gate stack, a dielectric material is deposited on the structure as an initial interlayer dielectric layer (ILD0). In one embodiment, dielectric material 140 is silicon dioxide or a low k dielectric material introduced as a blanket and then polished to expose sacrificial or dummy gate 125. Sacrificial or dummy gate 125 is then removed by, for example, an etch process. FIG. 5 shows the structure of FIG. 4 through line 5-5' also after a removal of the sacrificial or dummy gate stack. Referring to FIG. 4 and FIG. 5, structure 100 shows a fin or channel having a height, H, disposed between source 160A and drain 160B. The fin includes active layers and at least one sacrificial layer in an alternating stacked arrangement. FIG. 4 shows sacrificial layer 135A on substrate 110 (on optional buffer layer 120); active layer 136A on sacrificial layer 135A; sacrificial layer 135B on active layer 136A; and active layer 136B on sacrificial layer 135B.

As noted above, according to the embodiment, sacrificial layer 135A is used as an etch stop for removing fin material prior to forming each of source 160A and drain 160B. Thus, source 160A and drain 160B are formed on sacrificial layer 135A and extend, in the illustrated embodiment, to a height approximately the same or greater than a height of channel, H. In a shallow source and drain embodiment (see FIG. 3A), sacrificial layer 135B is used as an etch stop for removing fin material prior to forming each of a source and a drain.

FIG. 6 and FIG. 7 show the structure of FIG. 4 and FIG. 5, respectively, following a selective removal of sacrificial layers 135A and 135B on the substrate. Sacrificial layers 135A and 135B of a silicon germanium material may be selectively removed relative to active layers 136A and 136B of silicon by an etch process. One example of an etch chemistry to remove silicon germanium selectively relative to silicon is a citric acid/hydrofluoric acid/nitric acid chemistry. In one embodiment, the sacrificial layer beneath the source 160A and drain 160B is removed. In one embodiment, active layers 136A-136B and source 160A and drain 160B are supported by dielectric material 140 and thus remain intact following removal of sacrificial layers 135A-135B.

FIG. 8 and FIG. 9 show the structure of FIG. 6 and FIG. 7, respectively, following an introduction of dielectric material in the openings or volumes created by a removal of sacrificial layers 135A-135B. FIG. 8 and FIG. 9 show dielectric material 165 such as silicon dioxide or silicon nitride in the openings or volumes created by a removal of sacrificial layers 135A-135B. FIG. 8 and FIG. 9 show dielectric material 165 isolating active layers 136A and 136B of the device. In one embodiment, dielectric material 165 is also formed under source 160A and drain 160B. Thus, in one embodiment, dielectric material 165 completely surrounds active layer 136A and active layer 136B of fin 130.

FIG. 10 shows the structure of FIG. 8 following a selective removal of a portion of dielectric material 165 relative a material of active layer 136B by an etch process. FIG. 11A shows the structure of FIG. 9 following a removal of a portion of dielectric material 165 to expose active layer 136B (a recess of dielectric material 165 to expose less than all active layers of fin 130 in gate electrode region or channel region 145). FIG. 11A shows dielectric material 165 removed from gate electrode region 145 only to a depth to expose active layer 136B in the region. FIG. 11B shows the structure of FIG. 9 following an alternative removal of additional amounts of dielectric material 165 to also expose active layer 136A.

FIG. 12A and FIG. 12B show the structure of FIG. 11A and FIG. 11B, respectively, following an introduction of a gate stack in the gate electrode region (gate electrode region 145) to a height of the exposed active layer. A gate stack is introduced, e.g., deposited, on the structure including a gate dielectric and gate electrode. In an embodiment, gate electrode 180 of the gate electrode stack is composed of a metal gate and gate dielectric layer 190 is composed of a material having a dielectric constant greater than a dielectric constant of silicon dioxide (a high-K material). For example, in one embodiment, gate dielectric layer 190 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In one embodiment, gate electrode 180 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides.

As illustrated in FIGS. 12A and 12B, the active portion of a fin or channel of the device has a height with the gate stack (including gate electrode 180 or gate dielectric layer 190) surrounding the fin. The portion of the active layer(s) that the gate stack is on represents a channel region of the fin. In FIG. 12A, the height of the channel region is illustrated as $h_1$ representing the height of active layer 136B, the ultimate layer of the fin relative to a surface of substrate 110. The gate stack is formed from a point at an interface of active layer 136B and dielectric material 165. In one embodiment, the gate stack is formed on a superior surface of dielectric material 165. The gate stack is formed on opposing side surfaces of active layer 136B and a superior surface of active layer 136B. In FIG. 12B, the height of the active portion of the fin or the channel region is illustrated as $h_1+h_2$. Thus, a height dimension of the active fin or channel region in FIG. 12B is greater than the active fin or channel region in FIG. 12A. In FIG. 12B, the gate stack is formed from a point at an interface of active layer 136A and dielectric material 165. The gate stack in FIG. 12B is formed on opposing side surfaces of active layer 136A and active layer 136B and on a superior surface of active layer 136B (the ultimate layer of the fin). The gate stack is selectively on active layer 136B in FIG. 12A (selectively relative to active layer 136A) and on both active layer 136B and active layer 136A in FIG. 12B. In each of the embodiment of FIG. 12A and FIG. 12B, the gate stack is formed on opposing sidewall surfaces of an active layer (FIG. 12A) or layers (FIG. 12B) and on a superior surface of an ultimate active layer (as viewed). In another embodiment, the gate stack can be formed only on the sidewall surfaces and not on a superior surface of the ultimate active layer.

Figure 14:
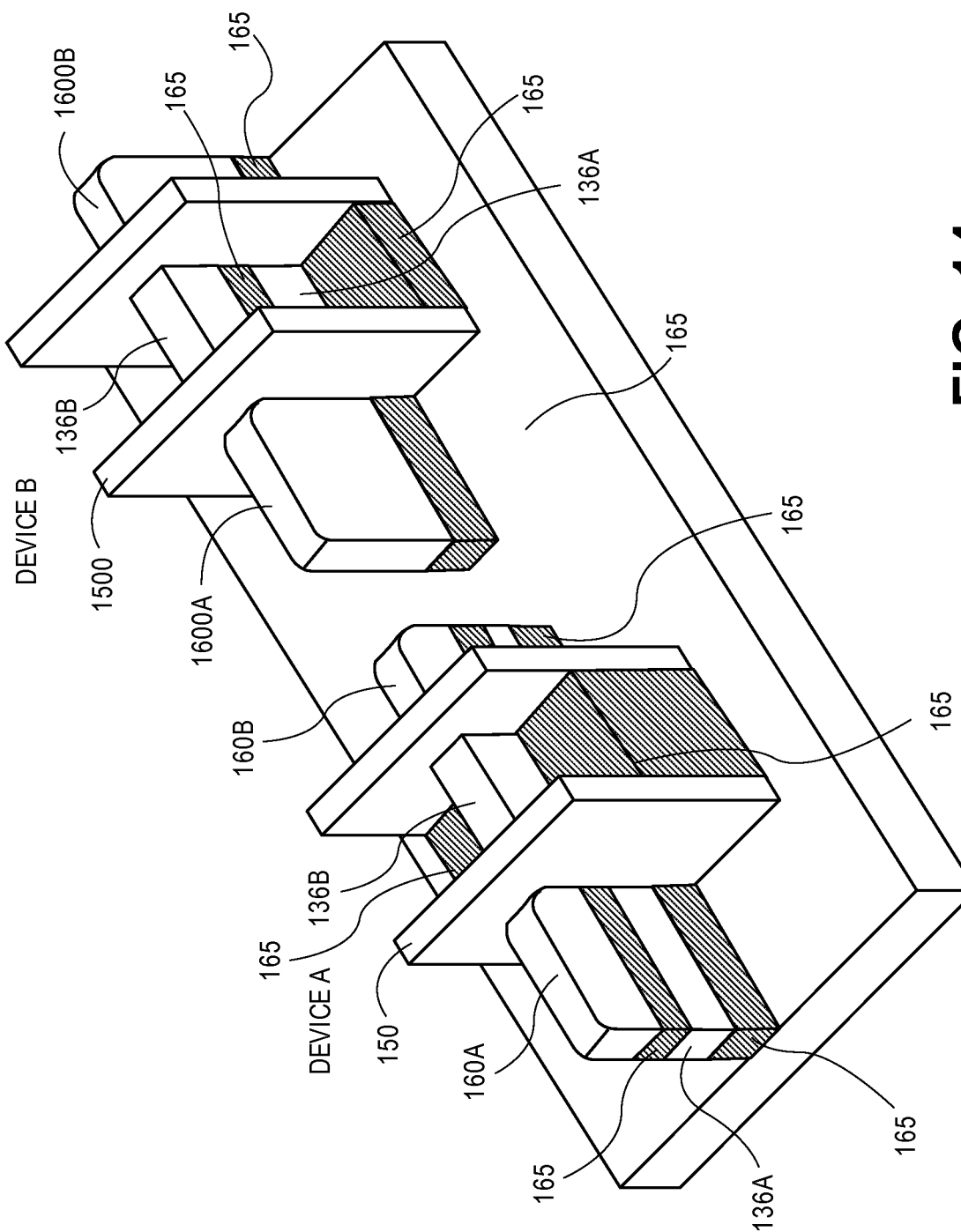
FIG. 14 shows a top perspective view of the structure of FIG. 13 with a gate electrode and a gate dielectric removed from each of the two devices.
Figure 15:
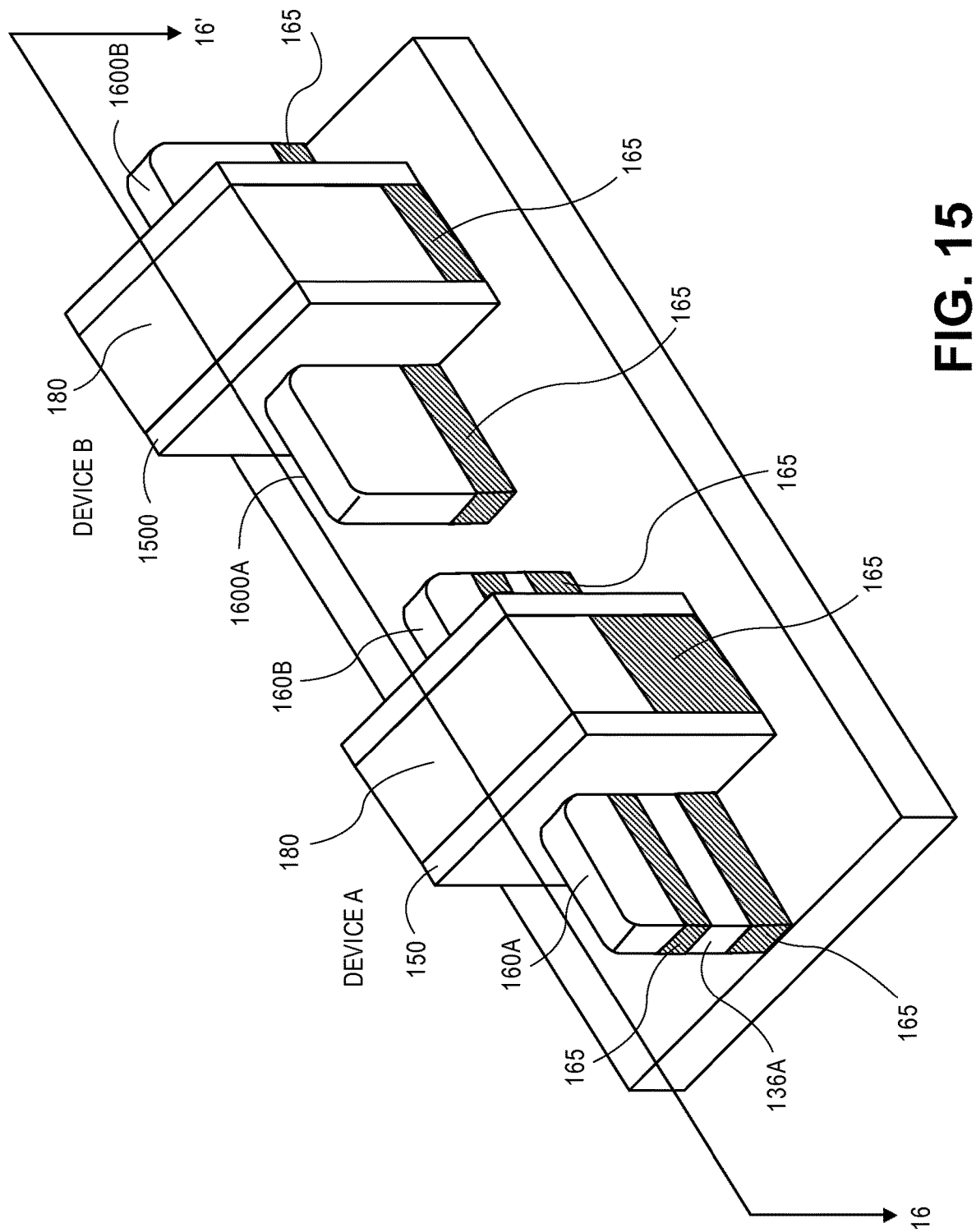
FIG. 15 shows a top perspective view of the structure of FIG. 13.

FIGS. 13-15 show expanded views of the structure of FIG. 12A to show the presence of two devices on the substrate. Device A is the device illustrated in FIG. 12A (active fin height $h_1$). Device B is a second three-dimensional or non-planar multi-gate device similar to the device illustrated in FIG. 12B and shows a fin having active material layers 1360A and 1360B, gate dielectric 1900 and gate electrode 1800 (active fin or channel height $h_1+h_2$). FIG. 14 shows a top perspective view of Device A and Device B with a gate dielectric and a gate electrode of each device removed. FIG. 15 shows the same top perspective view with the gate dielectric and gate electrode in place. It is appreciated that the devices illustrated would be covered by a dielectric material (e.g., ILD0). Such dielectric material is not illustrated for purposes of this discussion so as not to obscure the devices on the structure.

Referring to FIGS. 13-15, Device B on the same substrate as Device A has an active fin or channel height greater than the active fin or channel height of Device A. Thus, according to the process flow described herein, a method is illustrated for integrating devices of different active fin heights (different active channel dimensions (e.g., different volumes)) and optionally different source and drain depths on the same structure. Device A has a representatively shorter channel dimension than Device B. Device A and Device B can be formed in the same process flow. Representatively, to form Device B with the greater active channel dimensions, after removing or recessing dielectric material 165 to expose active layer 136B in Device A and active layer 1360B in Device B, as described with reference to FIG. 11A, Device A could be protected during the etch to remove or recess dielectric material 165 to expose active layer 1360A in Device B.

Representatively, Device A might be used in applications requiring lower capacitance and desiring less leakage. One example is a device for graphic applications. Device B, representatively, may be used for high performance applications where a high current is desired. In the illustration, device A has an active fin height approximately half the size of an active fin height of device B. It is appreciated that an active fin height may be modified to any desired height, including half the height, three-quarters of the height, one-quarter of the height, etc. by modifying a placement and/or thickness of alternating active and passive layers that form the fin.

In FIGS. 13-15, three-dimensional transistor device structures are illustrated with different channel heights. Representatively, a three-dimensional transistor device structure having channel height, $h_1$, (Device A, FIG. 13) may utilize the shallow source/drain configurations described with reference to FIG. 3A. In another embodiment, a three-dimensional transistor device structure having channel of height, $h_1$ may utilize the deep source/drain configuration described with reference to FIG. 3B. In one embodiment, a three-dimensional transistor device structure having a channel of height, $h_1+h_2$, may utilize the shallow source/drain configuration described with reference to FIG. 3A. In another embodiment, a three-dimensional transistor device structure having a channel of height, $h_1+h_2$, (Device B, FIG. 13) may utilize the deep source/drain configuration described with reference to FIG. 3B. Any embodiment of the devices may be formed on a structure individually or in combination with another embodiment or other devices, including other three-dimensional multi-gate devices.

Figure 16:
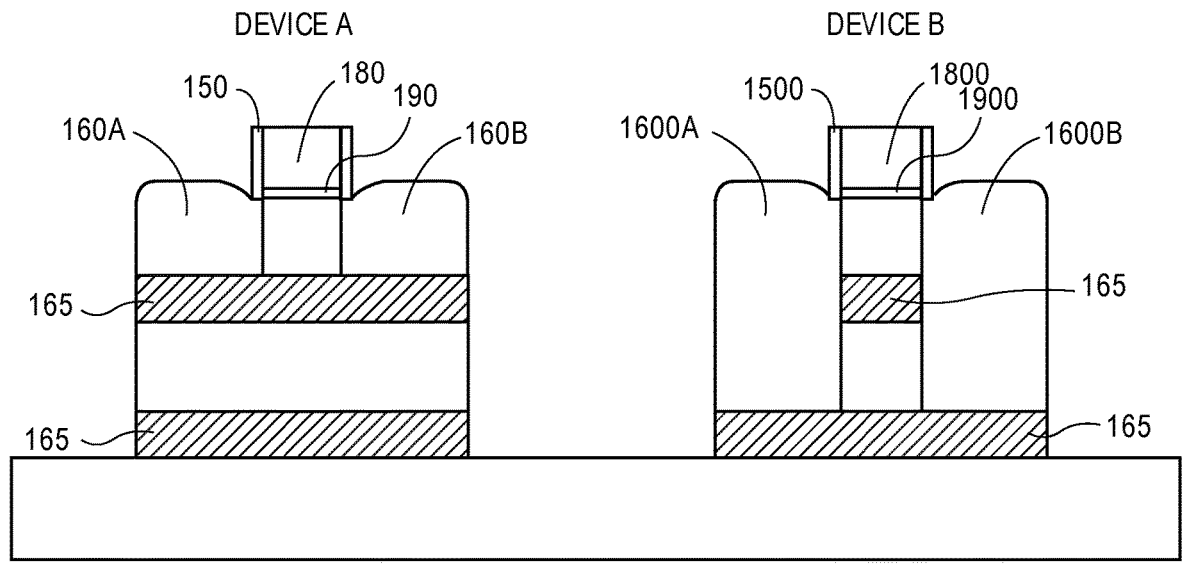
FIG. 16 shows the structure of FIG. 15 through an orthogonal cross-section and shows the two devices having different source and drain depths.

FIG. 16 shows a cross-section of the structure of FIG. 15 through line 16-16'. In this embodiment, in addition to having an active fin height, $h_1$, Device A has shallow source 160A and drain 160B (source and drain formed to a depth of dielectric material 165 between active layer 136B and active layer 136A (see FIG. 13)). Since a source and a drain of Device A were formed prior to replacing sacrificial material of fin 130 with dielectric material 165 (see FIG. 3A) and since sacrificial material 135B was used as an etch stop in the process of forming regions in the fin for a source and a drain, Device A has a source and a drain formed in active layer 136B to the exclusion of dielectric material 165 that is between active layer 136B and active layer 136A. Device A also includes gate electrode 180 between spacers 150 and on gate dielectric 190. Device B, in this embodiment, has deep source 1600A and deep drain 1600B (source and drain formed to a depth of dielectric material 165 under active layer 1360A (see FIG. 13)). Device B also includes gate electrode 1800 between spacers 1500 and on gate dielectric 1900.

Figure 17:
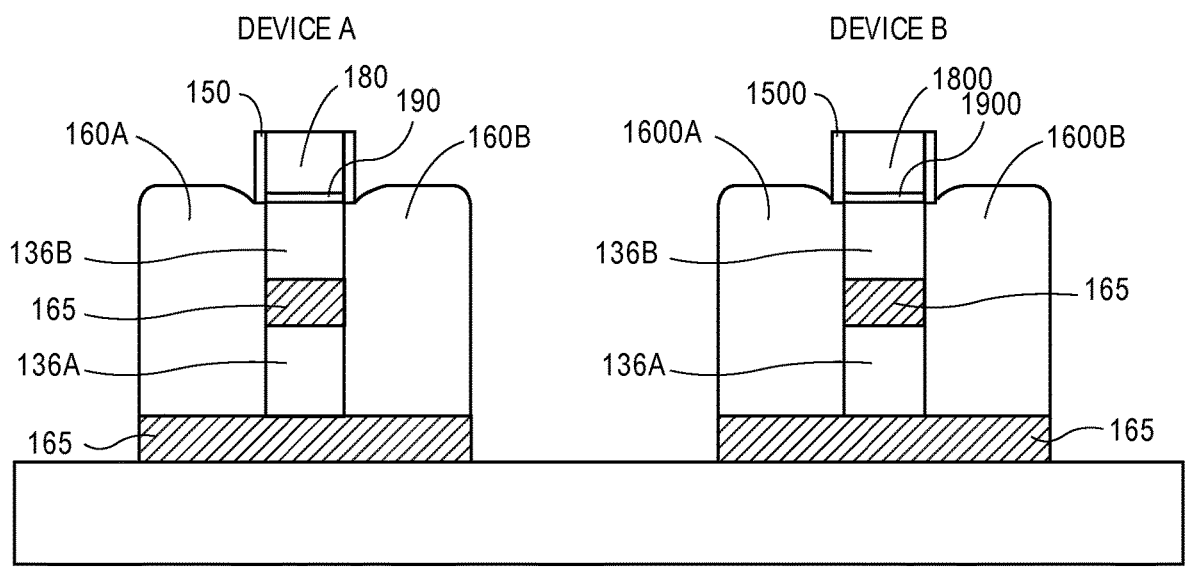
FIG. 17 shows a cross-sectional side view of another embodiment of two three-dimensional devices each having a different channel height and each having a similar source and drain depths.

FIG. 17 shows a cross-section of another embodiment of a structure including to multi-gate transistor devices having different channel heights. In this embodiment, each of Device A and Device B has deep source and drain (source and drain formed to a depth of dielectric material 165 under active layer 136A (see FIG. 13)).

Thus, according to the process flow described herein, a method is illustrated for integrating devices of different active fin heights (different active channel dimensions (e.g., different volumes)) and optionally different source and drain depths on the same structure. Device A has a representatively shorter channel dimension than Device B. Representatively, Device A might be used in applications requiring lower capacitance and desiring less leakage. One example is a device for graphic applications. Device B, representatively, may be used for high performance applications where a high current is desired. In the illustration, device A has an active fin height approximately half the size of an active fin height of device B. It is appreciated that an active fin height may be modified to any desired height, including half the height, three-quarters of the height, one-quarter of the height, etc. by modifying a placement and/or thickness of alternating active and passive layers that form the fin.

An additional benefit of the process described above is the isolation of a channel portion(s). As best illustrated in FIGS. 14-15, rather than having implants or dopant regions beneath each of source 160A or source 1600A and drain 160B or drain 1600B as an isolation technique, the device includes dielectric material 165 beneath the source and drain and under the channel to electrically isolate the device. It is noted that isolation can be implemented in each of the shallow source/drain (see Device A in FIG. 14) and deep source/drain (see Device B in FIG. 4) configurations.

Figure 18:
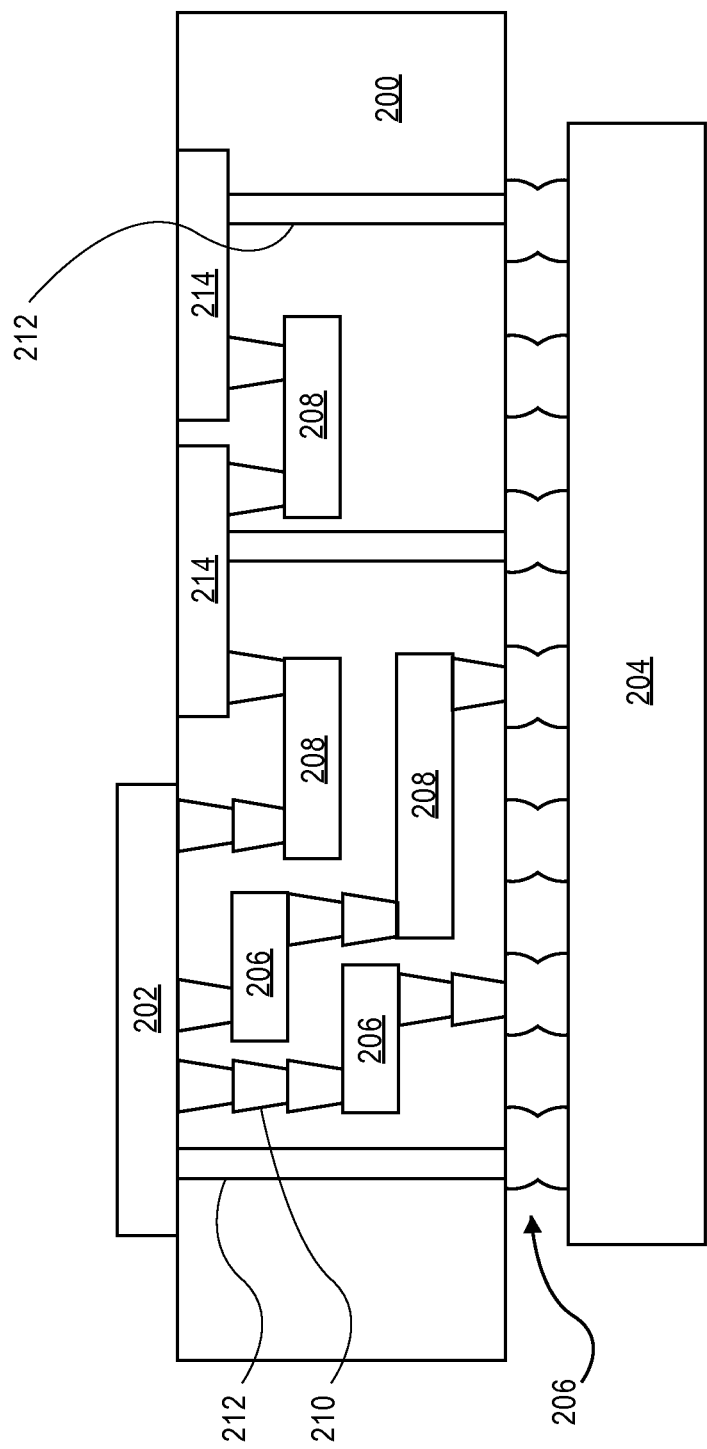
FIG. 18 is an interposer implementing one or more embodiments.

FIG. 18 illustrates an interposer that includes one or more embodiments. Interposer 200 is an intervening substrate used to bridge first substrate 202 to second substrate 204. First substrate 202 may be, for instance, an integrated circuit die. Second substrate 204 may be, for instance, a memory module, a computer motherboard, or another integrated circuit die. Generally, the purpose of interposer 200 is to spread a connection to a wider pitch or to reroute a connection to a different connection. For example, interposer 200 may couple an integrated circuit die to ball grid array (BGA) 206 that can subsequently be coupled to second substrate 204. In some embodiments, first and second substrates 202/204 are attached to opposing sides of interposer 200. In other embodiments, first and second substrates 202/204 are attached to the same side of interposer 200. In further embodiments, three or more substrates are interconnected by way of interposer 200.

Interposer 200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 208 and vias 210, including but not limited to through-silicon vias (TSVs) 212. Interposer 200 may further include embedded devices 214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 200.

In accordance with embodiments, apparatuses or processes disclosed herein may be used in the fabrication of interposer 200.

Figure 19:
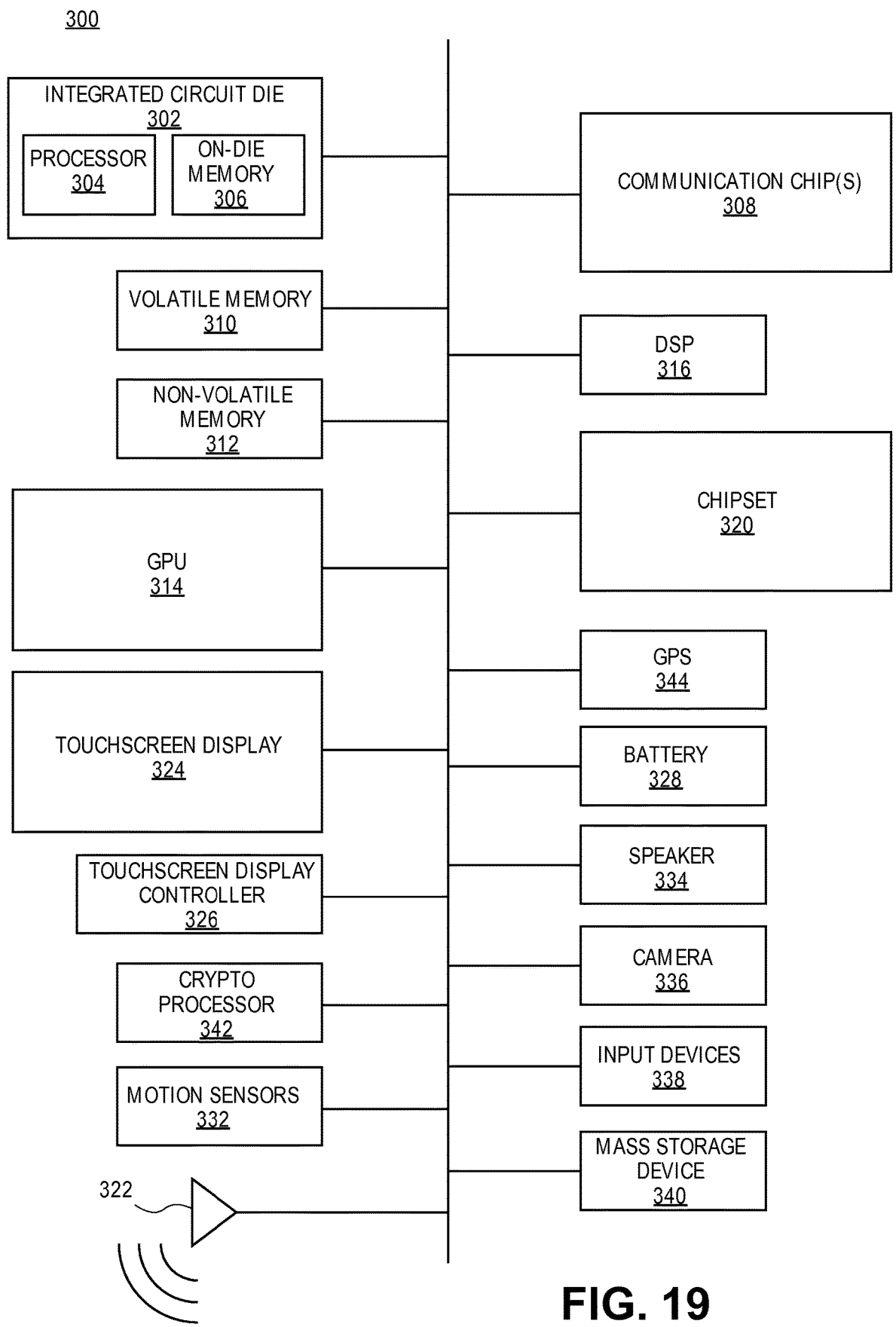
FIG. 19 illustrates an embodiment of a computing device.

FIG. 19 illustrates computing device 300 in accordance with one embodiment. Computing device 300 may include a number of components. In one embodiment, these components are attached to one or more motherboards. In an alternate embodiment, these components are fabricated onto a single system-on-a-chip (SoC) die rather than a motherboard. The components in computing device 300 include, but are not limited to, integrated circuit die 302 and at least one communication chip 308. In some implementations communication chip 308 is fabricated as part of integrated circuit die 302. Integrated circuit die 302 may include CPU 304 as well as on-die memory 306, often used as cache memory, that can be provided by technologies such as embedded DRAM (eDRAM) or spin-transfer torque memory (STTM or STTM-RAM).

Computing device 300 may include other components that may or may not be physically and electrically coupled to the motherboard or fabricated within an SoC die. These other components include, but are not limited to, volatile memory 310 (e.g., DRAM), non-volatile memory 312 (e.g., ROM or flash memory), graphics processing unit 314 (GPU), digital signal processor 316, crypto processor 342 (a specialized processor that executes cryptographic algorithms within hardware), chipset 320, antenna 322, display or a touchscreen display 324, touchscreen controller 326, battery 328 or other power source, a power amplifier (not shown), global positioning system (GPS) device 344, compass 330, motion coprocessor or sensors 332 (that may include an accelerometer, a gyroscope, and a compass), speaker 334, camera 336, user input devices 338 (such as a keyboard, mouse, stylus, and touchpad), and mass storage device 340 (such as hard disk drive, compact disk (CD), digital versatile disk (DVD), and so forth).

Communications chip 308 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 308 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 308. For instance, first communication chip 308 may be dedicated to shorter range wireless communications such as Wi-Fi and Bluetooth and a second communication chip 308 may be dedicated to longer range wireless communications such as GPS, EDGE, GPRS, CDMA, WiMAX, LTE, Ev-DO, and others.

Processor 304 of computing device 300 includes one or more devices, such as transistors or metal interconnects, that are formed in accordance with embodiments described herein including three-dimensional multi-gate transistor devices having tailored fin heights for a particular application (e.g., different fin heights on processor 304). The term "processor" may refer to any device or portion of a device that processes electronic data from registers and/or memory to transform that electronic data into other electronic data that may be stored in registers and/or memory.

The communication chip 308 may also include one or more devices, such as transistors or metal interconnects, that are formed in accordance with embodiments described above including three-dimensional transistor devices including modified or tailored fin heights.

In further embodiments, another component housed within the computing device 300 may contain one or more devices, such as transistors or metal interconnects, that are formed in accordance with implementations described above including three-dimensional transistor devices including modified or tailored fin heights.

In various embodiments, computing device 300 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 300 may be any other electronic device that processes data.

EXAMPLES

The following examples pertain to embodiments.

Example 1 is method including forming a fin of a non-planar device on a substrate, the fin including a second layer between a first layer and a third layer, the second layer including a material that is different from a material of the first layer and a material of the third layer; replacing the second layer with a dielectric material; and forming a gate stack on a channel region of the fin, the gate stack including a dielectric material and a gate electrode.

In Example 2, forming the fin of Example 1 includes forming a base layer on the substrate of a material similar to the second layer and forming the first layer on the base layer.

In Example 3, replacing the second layer with a dielectric material of Example 2 includes replacing both the second layer and the base layer with the dielectric material.

In Example 4, the second layer of any of Examples 1-3 includes a material that can be selectively etched relative to a material of the first layer and a material of the third layer.

In Example 5, the method of any of Examples 1-4 further includes forming a source and a drain in junction regions in the fin of the device on respective opposite sides of the channel.

In Example 6, the third layer includes an ultimate layer of the fin forming a source and a drain of Example 5 includes removing at least the third layer in the junction regions and introducing a junction material into the junction regions.

In Example 7, after replacing the second layer with a dielectric material, the method of any of Examples 1-6 includes exposing at least one of the first layer and the third layer in a gate electrode region.

In Example 8, the third layer comprises an ultimate layer of the fin and exposing at least one of the first and third layers of Example 7 includes exposing only the third layer and forming the gate stack includes forming the gate stack on the exposed third layer.

In Example 9, exposing at least one of the first layer and the third layer of Example 7 includes exposing each of the first layer and the third layer and forming the gate stack includes forming the gate stack on each of the exposed first layer and third layer.

In Example 10, the forming the gate stack of any of Examples 1-9 includes forming the gate stack selectively on the first layer relative to the third layer.

Example 11 is an apparatus including a first non-planar multi-gate device on a substrate including a fin disposed on a surface of the substrate including a conducting layer on a dielectric layer, a gate stack disposed on the conducting layer in a channel region of the fin, the gate stack including a gate dielectric material and a gate electrode, and a source and a drain formed in the fin on opposite sides of the channel region, the source and the drain formed in a portion of the conducting layer to the exclusion of the dielectric layer; and a second non-planar multi-gate device on the substrate including a fin disposed on a surface of the substrate including a first conducting layer and a second conducting layer separated by a dielectric layer, a gate stack disposed on each of the first conducting layer and the second conducting layer in a channel region of the fin, the gate stack including a gate dielectric material and a gate electrode, and a source region and a drain region formed in the fin on opposite sides of the channel region, the source and the drain formed in each of the first conducting layer and the second conducting layer of the fin.

In Example 12, the conducting layer of the fin of the first multi-gate device of Example 11 is the ultimate layer of the fin and the gate stack of the first multi-gate device is formed from an interface of the conducting layer and the dielectric layer on opposing side surfaces of the conducting layer.

In Example 13, the fin of the first multi-gate device of any of Example 11 or 12 includes a height dimension defined by a thickness of the conducting layer, a thickness of the dielectric layer and a thickness of a third layer, wherein the conducting layer is separated from the third layer by the dielectric layer.

In Example 14, the fin of the first multi-gate device and the fin of the second multi-gate device of any of Examples 11-13 include similar material layers.

In Example 15, the source and the drain of the first multi-gate device of any of Examples 11-14 are formed to a depth of the dielectric layer.

In Example 16, the second conducting layer of the fin of the second multi-gate device of any of Examples 11-15 is the ultimate layer of the fin and the gate stack of the second multi-gate device is formed on opposing side surfaces of the first conducting layer, the dielectric layer and the second conducting layer of the second conducting layer.

In Example 17, the dielectric layer of the fin of the second multi-gate device of any of Examples 11-16 is a second dielectric layer, the fin further including a first dielectric layer, wherein the first conducting layer is disposed on the first dielectric layer.

In Example 18, the source and the drain of the second multi-gate device of Example 16 are formed to a depth of the first dielectric layer.

Example 19 is an apparatus including a first non-planar multi-gate device on a substrate including a fin disposed on a surface of the substrate including a conducting layer and a second layer separated by a dielectric layer, a gate stack disposed on the first conducting layer in a channel region of the fin, the gate stack including a gate dielectric material and a gate electrode, and a source and a drain formed in the fin on opposite sides of the channel region, the source and the drain formed in each of the first conducting layer and the second layer of the fin; and a second non-planar multi-gate device on the substrate including a fin disposed on a surface of the substrate including a first conducting layer and a second conducting layer separated by a dielectric layer, a gate stack disposed on each of the first conducting layer and the second conducting layer in a channel region of the fin, the gate stack including a gate dielectric material and a gate electrode, and a source and a drain formed in the fin on opposite sides of the channel region, the source and the drain formed in each of the first conducting layer and the second conducting layer of the fin.

In Example 20, the conducting layer of the fin of the first multi-gate device of Example 19 is the ultimate layer of the fin and the gate stack of the first multi-gate device is formed from an interface between the second conducting layer and the dielectric layer on opposing side surfaces of the second conducting layer and on a superior surface of the conducting layer.

In Example 21, the fin of the first multi-gate device and the fin of the second multi-gate device of Example 19 or Example 20 include similar material layers.

In Example 22, the second conducting layer of the fin of the second multi-gate device of any of Examples 19-21 is the ultimate layer of the fin and the gate stack of the second multi-gate device is formed on opposing side surfaces of the first conducting layer, the dielectric layer and the second conducting layer of the second conducting layer.

In Example 23, the dielectric layer of the fin of the second multi-gate device of any of Examples 19-22 is a second dielectric layer, the fin further including a first dielectric layer, wherein the first conducting layer is disposed on the first dielectric layer.

In Example 24, the source and the drain of the second multi-gate device of Example 23 are formed to a depth of the first dielectric layer.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method comprising:

forming a fin of a non-planar device on a substrate, the fin comprising a second layer between a first layer and a third layer, the second layer comprising a material that is different from a material of the first layer and a material of the third layer, wherein the third layer of the fin comprises a semiconductor material having a top surface;

replacing the second layer with a dielectric material;

forming a gate stack on a channel region of the fin, the gate stack comprising a gate dielectric material and a gate electrode, wherein the gate stack is directly on the top surface of the semiconductor material of the third layer of the fin, wherein a portion of the gate stack is adjacent to the dielectric material, and wherein the gate stack has a bottommost surface; and forming a source and a drain in junction regions in the fin of the device on respective opposite sides of the channel, wherein the dielectric material extends between but not into the source and the drain, wherein the source and the drain have a bottommost surface co-planar with the bottommost surface of the gate stack, and wherein the bottommost surface of the source and the drain and the bottommost surface of the gate stack are on a dielectric structure having a same footprint as a footprint of the source and the drain and the gate stack.

2. The method of claim 1, wherein forming the fin comprises forming a base layer on the substrate of a material similar to the second layer and forming the first layer on the base layer.

3. The method of claim 2, wherein replacing the second layer with a dielectric material comprises replacing both the second layer and the base layer with the dielectric material.

4. The method of claim 1, wherein the second layer comprises a material that can be selectively etched relative to a material of the first layer and a material of the third layer.

5. The method of claim 1, wherein the third layer comprises an ultimate layer of the fin, and forming a source and a drain comprises removing at least the third layer in the junction regions and introducing a junction material into the junction regions.

6. The method of claim 1, wherein after replacing the second layer with a dielectric material, the method comprises exposing at least one of the first layer and the third layer in a gate electrode region.

7. The method of claim 6, wherein the third layer comprises an ultimate layer of the fin and exposing at least one of the first and third layers comprises exposing only the third layer and forming the gate stack comprises forming the gate stack on the exposed third layer.

8. The method of claim 6, wherein exposing at least one of the first layer and the third layer comprises exposing each of the first layer and the third layer and forming the gate stack comprises forming the gate stack on each of the exposed first layer and third layer.

9. The method of claim 1, wherein the forming the gate stack comprises forming the gate stack selectively on the first layer relative to the third layer.

10. An apparatus comprising:

a first non-planar multi-gate device on a substrate comprising a fin disposed on a surface of the substrate, the fin comprising a conducting layer on a dielectric layer, a gate stack disposed on the conducting layer in a channel region of the fin, the gate stack comprising a gate dielectric material and a gate electrode, and a source and a drain formed in the fin on opposite sides of the channel region, the source and the drain formed in a portion of the conducting layer, wherein the gate stack of the first non-planar multi-gate device has a bottommost surface, and wherein the gate stack of the first non-planar multi-gate device is disposed directly on a top surface of the conducting layer; and a second non-planar multi-gate device on the substrate comprising a fin disposed on a surface of the substrate comprising a first conducting layer and a second conducting layer separated by a dielectric layer, a gate stack disposed on each of the first conducting layer and the second conducting layer in a channel region of the fin, the gate stack comprising a gate dielectric material and a gate electrode, and a source and a drain formed in the fin on opposite sides of the channel region, wherein the dielectric layer extends between but not into the source and the drain, wherein the gate dielectric material of the gate stack of the second non-planar multi-gate device has a bottommost surface below the bottommost surface of the gate dielectric material of the gate stack of the first non-planar multi-gate device, wherein the gate stack of the second non-planar multi-gate device is disposed directly on a top surface of the second conducting layer, and wherein the source and the drain of the second non-planar multi-gate device have a bottommost surface co-planar with a bottommost surface of the gate stack of the second non-planar multi-gate device, and wherein the bottommost surface of the source and the drain of the second non-planar multi-gate device and the bottommost surface of the gate stack are on a dielectric structure having a same footprint as a footprint of the source and the drain and the gate stack of the second non-planar multi-gate device.

11. The apparatus of claim 10, wherein the conducting layer of the fin of the first multi-gate device is the ultimate layer of the fin and the gate stack of the first multi-gate device is formed from an interface of the conducting layer and the dielectric layer on opposing side surfaces of the conducting layer.

12. The apparatus of claim 10, wherein the fin of the first multi-gate device comprises a height dimension defined by a thickness of the conducting layer, a thickness of the dielectric layer and a thickness of a third layer, wherein the conducting layer is separated from the third layer by the dielectric layer.

13. The apparatus of claim 10, wherein the fin of the first multi-gate device and the fin of the second multi-gate device comprise similar material layers.

14. The apparatus of claim 10, wherein the source and the drain of the first multi-gate device are formed to a depth of the dielectric layer.

15. The apparatus of claim 10, wherein the second conducting layer of the fin of the second multi-gate device is the ultimate layer of the fin and the gate stack of the second multi-gate device is formed on opposing side surfaces of the first conducting layer, the dielectric layer and the second conducting layer.

16. The apparatus of claim 10, wherein the dielectric layer of the fin of the second multi-gate device is a second dielectric layer, the fin further comprising a first dielectric layer, wherein the first conducting layer is disposed on the first dielectric layer.

17. The apparatus of claim 16, wherein the source and the drain of the second multi-gate device are formed to a depth of the first dielectric layer.

18. An apparatus comprising:
- a first non-planar multi-gate device on a substrate comprising a fin disposed on a surface of the substrate comprising a first layer and a second layer separated by a dielectric layer, a gate stack disposed on the first layer in a channel region of the fin, the gate stack comprising a gate dielectric material and a gate electrode, and a source and a drain formed in the fin on opposite sides of the channel region, the source and the drain formed in a topmost one of the first layer and the second layer of the fin, wherein the gate stack of the first non-planar multi-gate device has a bottommost surface, wherein the first layer of the fin comprises a semiconductor material having a top surface, and wherein the gate stack of the first non-planar multi-gate device is directly on the top surface of the semiconductor material first layer of the fin; and
- a second non-planar multi-gate device on the substrate comprising a fin disposed on a surface of the substrate comprising a first conducting layer and a second conducting layer separated by a dielectric layer, a gate stack disposed on each of the first conducting layer and the second conducting layer in a channel region of the fin, the gate stack comprising a gate dielectric material and a gate electrode, and a source and a drain formed in the fin on opposite sides of the channel region, wherein the dielectric layer extends between but not into the source and the drain, wherein the gate dielectric material of the gate stack of the second non-planar multi-gate device has a bottommost surface below the bottommost surface of the gate dielectric material of the gate stack of the first non-planar multi-gate device, wherein the gate stack of the second non-planar multi-gate device is directly on a top surface of the second conducting layer, and wherein the source and the drain of the second non-planar multi-gate device have a bottommost surface co-planar with a bottommost surface of the gate stack of the second non-planar multi-gate device, and wherein the bottommost surface of the source and the drain of the second non-planar multi-gate device and the bottommost surface of the gate stack are on a dielectric structure having a same footprint as a footprint of the source and the drain and of the gate stack of the second non-planar multi-gate device.

19. The apparatus of claim 18, wherein the fin of the first multi-gate device and the fin of the second multi-gate device comprise similar material layers.

20. The apparatus of claim 18, wherein the second conducting layer of the fin of the second multi-gate device is the ultimate layer of the fin and the gate stack of the second multi-gate device is formed on opposing side surfaces of the first conducting layer, the dielectric layer and the second conducting layer.

21. The apparatus of claim 18, wherein the dielectric layer of the fin of the second multi-gate device is a second dielectric layer, the fin further comprising a first dielectric layer, wherein the first conducting layer is disposed on the first dielectric layer.

22. The apparatus of claim 21, wherein the source and the drain of the second multi-gate device are formed to a depth of the first dielectric layer.

\* \* \* \* \*